(12) United States Patent
Nakao et al.

(10) Patent No.: US 7,888,622 B2
(45) Date of Patent: Feb. 15, 2011

(54) HEAT-PROCESSING FURNACE AND MANUFACTURING METHOD THEREOF

(75) Inventors: Ken Nakao, Nirasaki (JP); Kenichi Yamaga, Nirasaki (JP); Makoto Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 613 days.

(21) Appl. No.: 11/902,333

(22) Filed: Sep. 20, 2007

(65) Prior Publication Data

US 2008/0073334 A1 Mar. 27, 2008

(30) Foreign Application Priority Data

Sep. 22, 2006 (JP) ............................. 2006-257388
Sep. 12, 2007 (JP) ............................. 2007-236512

(51) Int. Cl.
*F27D 11/00* (2006.01)
*H05B 3/00* (2006.01)

(52) U.S. Cl. ..................... 219/385; 219/389; 219/390; 219/391; 219/393; 219/395; 219/396; 219/402; 219/403; 219/406; 219/407; 219/408; 29/611; 373/110; 373/112; 373/118; 373/119; 373/127; 373/128; 373/130; 373/131

(58) Field of Classification Search ................ 219/385, 219/389–91, 393, 395–6, 402–3, 406–8; 373/110–112, 118–9, 127–8, 130–31; 29/611
See application file for complete search history.

(56) References Cited

U.S. PATENT DOCUMENTS 6,008,477 A * 12/1999 Nakao et al. ................ 219/390

FOREIGN PATENT DOCUMENTS

| JP | 7-253276 | * 10/1995 |
| JP | 10-233277 | 9/1998 |
| JP | 2006-80058 | * 3/2006 |

OTHER PUBLICATIONS

Chinese Office Action issued on Dec. 18, 2009 for Chinese Application No. 200710182166X w/ English translation.

* cited by examiner

*Primary Examiner*—Shawntina Fuqua
(74) *Attorney, Agent, or Firm*—Smith, Gambrell & Russell, LLP

(57) ABSTRACT

A heat-processing furnace comprises: a processing vessel for housing an object to be processed to thermally heat the object to be processed; a cylindrical heat insulating member surrounding the processing vessel; a helical heating resistor disposed along an inner circumferential surface of the heat insulating member; and support members axially disposed on the inner circumferential surface of the heat insulating member, for supporting the heating resistor at predetermined pitches. A plurality of terminal plates are disposed outside the heating resistor at suitable intervals therebetween and attached to the heating resistor, the terminal plates radially passing through the heat insulating member to be extended outside. A plurality of fixing plates are disposed outside the heating resistor at suitable intervals therebetween and attached to the heating resistor, the fixing plates being fixed in the heat insulating member. The fixing plates are attached to the heating resistor by the same attachment structure as the attachment structure of the terminal plates to the heating resistor.

8 Claims, 7 Drawing Sheets

HEAT-PROCESSING FURNACE AND MANUFACTURING METHOD THEREOF

CROSS REFERENCE TO RELATED APPLICATIONS

This application is based upon and claims the benefit of priority from the prior Japanese Patent Application No. 2006-257388 filed on Sep. 22, 2006 and the prior Japanese Patent Application No. 2007-236512 filed on Sep. 12, 2007, the entire contents of which are incorporated herein by reference.

BACKGROUND OF THE INVENTION

1. Field of the Invention

The present invention relates to a heat-processing furnace and a manufacturing method thereof.

2. Related Art

In a manufacturing process of a semiconductor device, various heat-processing apparatuses are used to subject a semiconductor wafer as an object to be processed to an oxidation process, a diffusion process, and a CVD (Chemical Vapor Deposition) process. A general heat-processing apparatus includes a heat-processing furnace formed of: a processing vessel (reaction tube) in which a semiconductor wafer is housed and heat-processed; a heating resistor disposed around the processing vessel; and a heat insulating member disposed around the heating resistor. The heating resistor is arranged on an inner wall surface of the heat insulating member through a support member.

In the case of a heat-processing apparatus capable of performing a batch process, a helical heater line arranged along an inner wall surface of a cylindrical heat insulating member is used as the heating resistor. Thus, an inside of a furnace can be heated at a high temperature such as 800° C. to 1000° C. As the heat insulating member, there is used a heat insulating member made by baking a heat insulating material such as ceramic fibers into a cylindrical shape. Thus, a heat quantity taken away as a radiant heat and a conductive heat can be reduced to promote an efficient heating operation. As the support member, a support member made of, e.g., ceramics is used to support the heater line at predetermined pitches to allow a thermal expansion and a thermal shrinkage of the heater line.

In the above heat-processing furnace, the heater line is formed into a helical shape, and is supported with a clearance between the heater line and the heat insulating member such that the heater line can thermally expand and thermally shrink. However, use of the heating line under a high temperature invites a creep strain, so that a length of the heating line is gradually increased. In addition, the heater line thermally expands upon heating. Further, a certain heater line is rapidly cooled by blowing air thereto so as to lower the temperature. When the temperature of the heater line is repeatedly elevated and lowered, the heater line is deformed. Then, there is a possibility that the heater line is broken because of a short circuit formed between a part of the heater line and an adjacent part thereof.

Particularly in a vertical heat-processing furnace, because of repeated thermal expansions and thermal shrinkages of a heater line caused by repeated fluctuation in temperature, the heater line is gradually, slightly moved downward in a support member by gravitation. Since the amount of movement is accumulated at a lowermost turn, a winding diameter of the heater line is increased by the movement accumulation. When the heating line reaches an inner surface of the heat insulating member, since the heater line cannot expand outward any more, the heater line is vertically deformed. As a result, there is a possibility that the heater line is broken because of a short circuit formed between a part of the heater line and an adjacent part thereof.

In order to solve this problem, i.e., in order to prevent accumulation of elongation of a heater line on one side, which is caused by a creep or a thermal expansion of the heater line, there has been proposed that a rod-like fixing member projecting radially outward from a furnace is disposed on an outside part of a heating resistor by welding, and an end of the fixing member is buried in a heat insulating member to be fixed therein (see, JP10-233277A).

However, since the fixing member is merely joined by welding to the outside part of the heating resistor, not only the joint is exposed to a high temperature, but also a stress tends to be concentrated on the joint when the heating resistor thermally expands and shrinks, whereby durability may be degraded (life duration is shortened). Further, since the fixing member has a rod-like shape, the fixing member is easily escaped from the heat insulating member, which results in inferior sustainability. Namely, it may be difficult to maintain a fixing performance of the heating resistor to thereby degrade durability.

The present invention has been made in view of the foregoing circumstances. The object of the present invention is to provide a heat-processing furnace and a manufacturing method thereof having an improved durability as compared with a conventional fixing member of a heating resistor.

SUMMARY OF THE INVENTION

The heat-processing furnace of the present invention is a heat-processing furnace comprising: a processing vessel for housing an object to be processed to thermally heat the object to be processed; a cylindrical heat insulating member surrounding the processing vessel; a helical heating resistor disposed along an inner circumferential surface of the heat insulating member; support members axially disposed on the inner circumferential surface of the heat insulating member, for supporting the heating resistor at predetermined pitches; a plurality of terminal plates disposed outside the heating resistor at suitable intervals therebetween and attached to the heating resistor, the terminal plates radially passing through the heat insulating member to be extended outside; and a plurality of fixing plates disposed outside the heating resistor at suitable intervals therebetween and attached to the heating resistor, the fixing plates being fixed in the heat insulating member; wherein the fixing plates are attached to the heating resistor by the same attachment structure as the attachment structure of the terminal plates to the heating resistor.

In the heat-processing furnace of the present invention, it is preferable that the heating resistor includes a pair of end parts formed by severing a part where the fixing plate is to be attached, and a bent part of an R-bent shape formed by bending each end part, which has been formed by severing the heating resistor, radially outward the heat insulating member, and that opposite surfaces of the fixing plate are sandwiched between the pair of end parts of the heating resistor, and are fixed on the pair of end parts by welding.

In the heat-processing furnace of the present invention, it is preferable that the fixing plate is made of the same material as that of the terminal plate, and has the same cross sectional shape as that of the terminal plate, the fixing plate being embedded in the heat insulating member so as not to project outside.

In the heat-processing furnace of the present invention, it is preferable that the heating resistor is supported by the supporting members with a predetermined gap between the heating resistor and the inner circumferential surface of the heat insulating member, in such a manner that the heating resistor can thermally expand and thermally shrink.

In the heat-processing furnace of the present invention, it is preferable that each support member includes a proximal part positioned inside the heating resistor, and a plurality of support pieces radially extended outward from the proximal part, and that each support piece is provided, at a radially outward distal end thereof, with an enlarged portion or a projection.

In the heat-processing furnace of the present invention, it is preferable that each fixing plate is directly fixed on a side surface of the heating resistor, and each fixing plate is embedded in the heat insulating member.

In the heat-processing furnace of the present invention, it is preferable that each fixing plate is embedded in the heat insulating member, and a distal end of each fixing plate is bent in the heat insulating member.

In the heat-processing furnace of the present invention, it is preferable that each fixing plate has a thinner part and a thicker part disposed on a distal end of the thinner part.

In the heat-processing furnace of the present invention, it is preferable that each fixing plate passes radially through the heat insulating member to be extended outside, and is fixed outward the heat insulating member by fixing means.

The manufacturing method of a heat-processing furnace of the present invention is a method of manufacturing a heat-processing furnace including a processing vessel for housing an object to be processed to thermally heat the object to be processed; a cylindrical heat insulating member surrounding the processing vessel; a helical heating resistor disposed along an inner circumferential surface of the heat insulating member; support members axially disposed on the inner circumferential surface of the heat insulating member, for supporting the heating resistor at predetermined pitches; the method comprising the steps of: preparing a helical heating resistor to which a plurality of terminal plates and a plurality of fixing plates are fixed by the same attachment structure, support members each having a proximal part positioned inside the heating resistor and a plurality of support pieces radially extended outward from the proximal part, and a jig for positioning the support members at predetermined circumferential positions and axially aligning the support members, mounting the heating resistor on the jig by using the supporting members, while rotating the jig; arranging a filter member on an outer circumference of the heating resistor, with avoiding the terminal plates, the fixing plates, and the supporting pieces of the respective support members, and arranging a plurality of bar members of a small diameter at suitable intervals therebetween on the filter member; immersing the heating resistor in a suspension containing inorganic fibers as a heat insulating material, and thereafter depositing the heat insulating material on the filter member by a suction from an inside of the heating resistor; drying the heat insulating material deposited on the filter member to form a heat insulating member; after the drying step, drawing out the bar members from a space between the heat insulating member and the filter member; drawing out the filter member from a space between the heat insulating member and the heating resistor; and removing the jig from the supporting members.

In the manufacturing method of a heat-processing furnace of the present invention, it is preferable that the step of preparing a helical heating resistor to which a plurality of terminal plates and a plurality of fixing plates are fixed by the same attachment structure comprises the step of: severing the heating resistor at a part where the fixing plate is to be attached, so as to form a pair of end parts; bending each end part, which has been formed by the severing step, radially outward the heat insulating member, so as to form a bent part of an R-bent shape; and sandwiching opposite surfaces of the fixing plate between the pair of end parts of the heating resistor, and fixing the fixing plate between the pair of end parts by welding.

According to the present invention, the plurality of fixing plates arranged at suitable intervals therebetween are disposed outside the heating resistor and are fixed in the heat insulating member. Since the fixing plates are attached to the heating resistor by the same attachment structure as the attachment structure of the terminal plates to the heating resistor, it is possible to restrain increase in temperature of the joints of the fixing plates and concentration of stress applied thereto. In addition, an excellent sustainability can be provided in that the fixing plates are rarely escaped from the heat insulating member, whereby durability of the heat-processing furnace including the heating resistor can be enhanced.

PREFERRED EMBODIMENTS OF THE INVENTION

Figure 1:
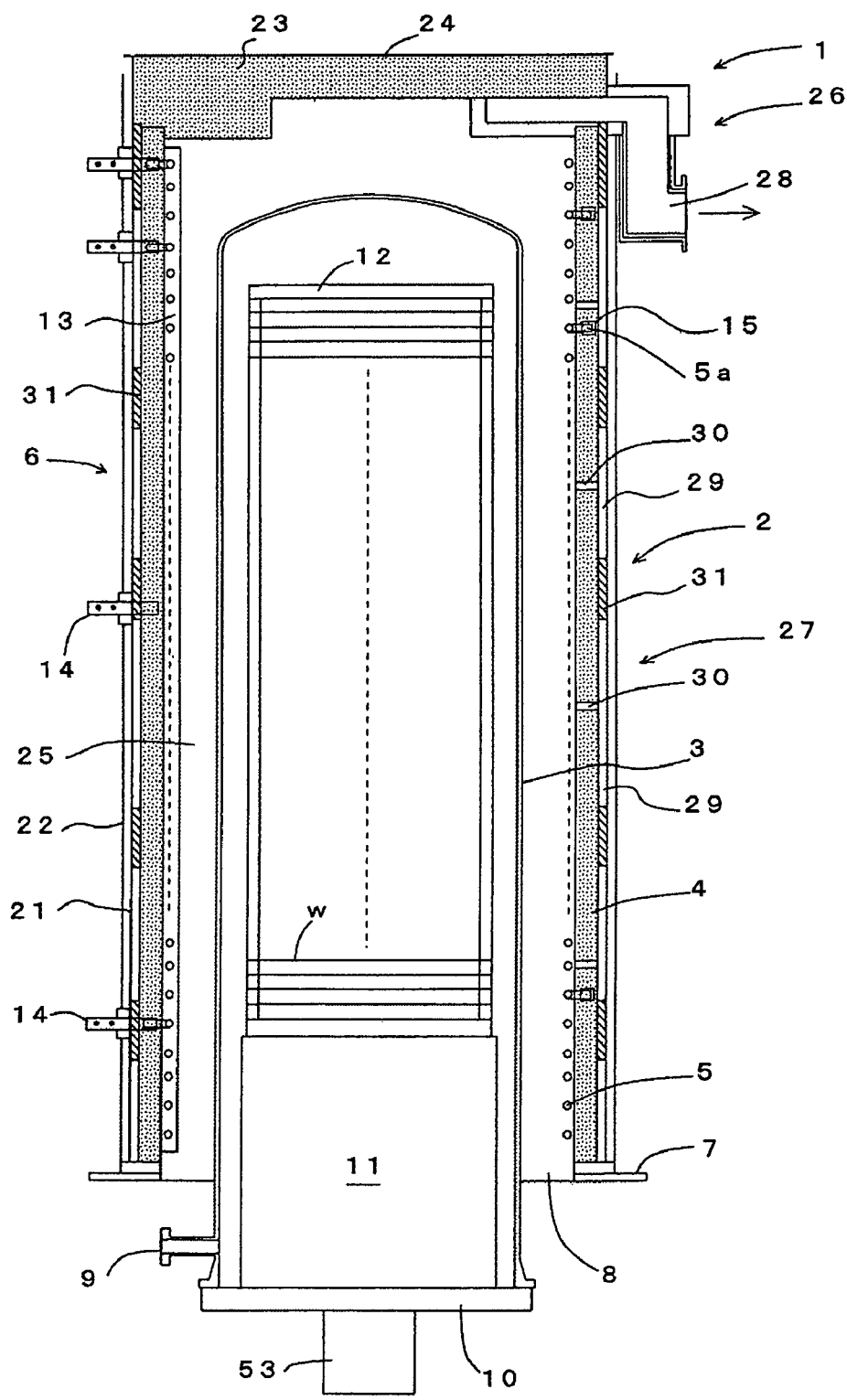
FIG. 1 is a longitudinal sectional view schematically showing an embodiment of a heat-processing furnace of the present invention.
Figure 2:
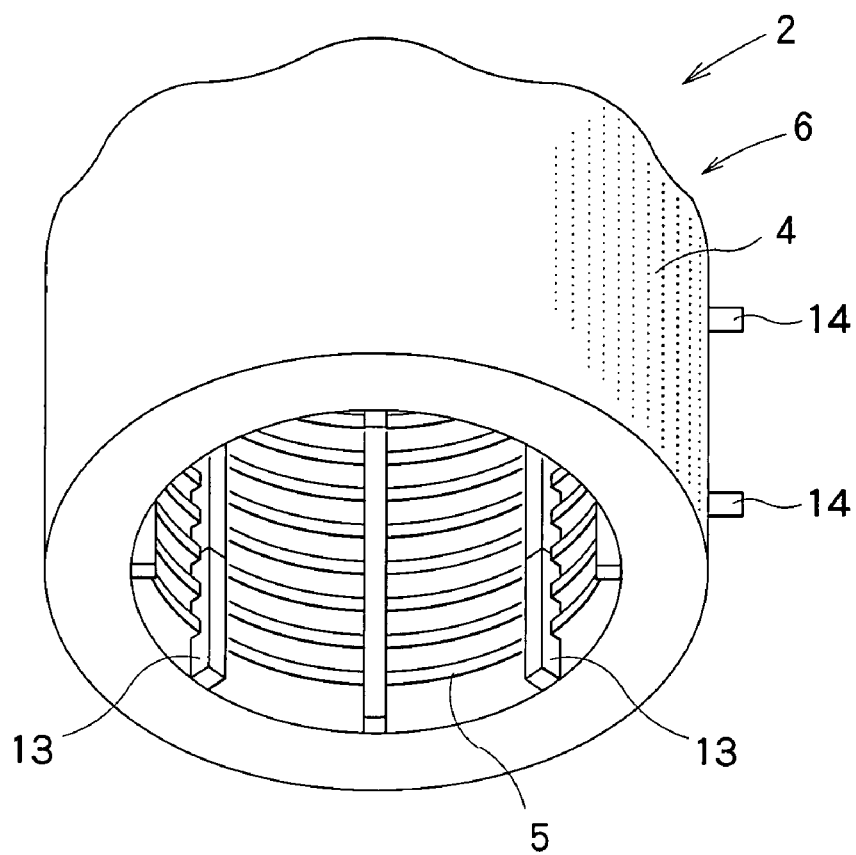
FIG. 2 is a perspective view showing a part of the heat-processing furnace.
Figure 3:
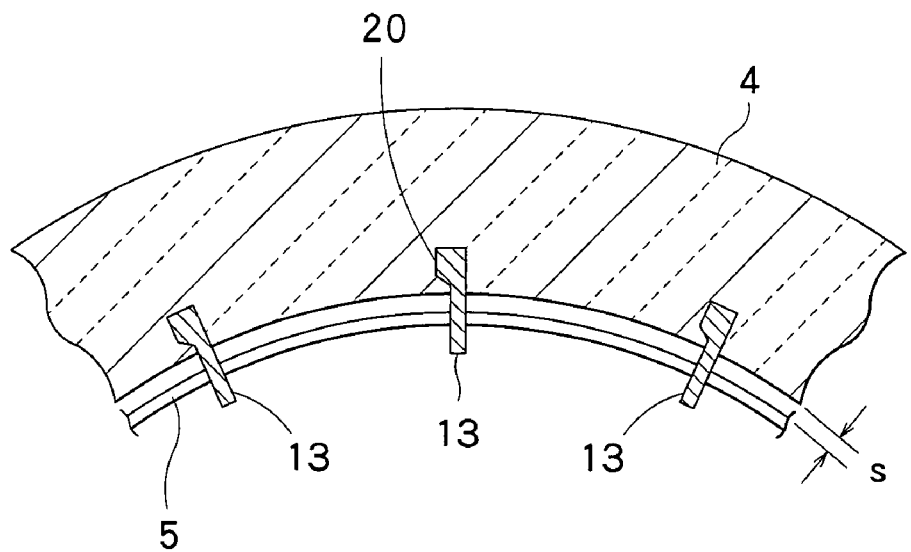
FIG. 3 is a partially sectional view of the heat-processing furnace.
Figure 4:
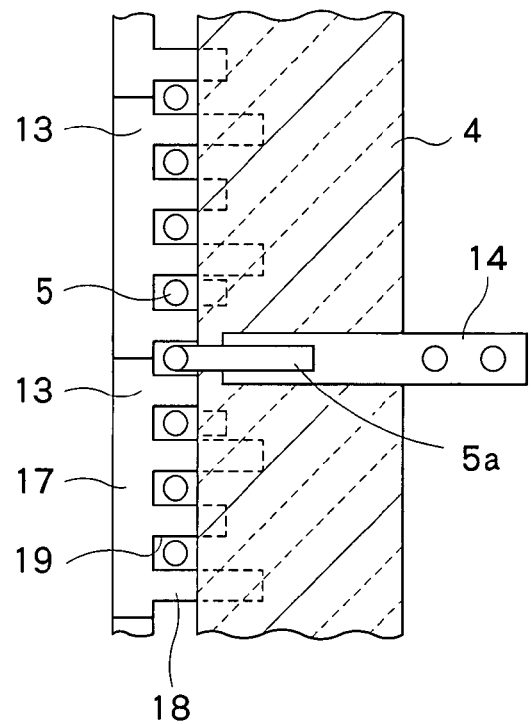
FIG. 4 is a partially longitudinal sectional view of the heat-processing furnace.

Preferred embodiments for carrying out the present invention will be described herebelow with reference to the accompanying drawings. FIG. 1 is a longitudinal sectional view schematically showing an embodiment of a heat-processing furnace of the present invention. FIG. 2 is a perspective view showing a part of the heat-processing furnace. FIG. 3 is a partially sectional view of the heat-processing furnace. FIG. 4 is a partially longitudinal sectional view of the heat-processing furnace.

In FIG. 1, the reference number 1 depicts a vertical heat-processing apparatus which is a kind of semiconductor manufacturing apparatuses. The heat-processing apparatus 1 includes a vertical heat-processing furnace 2 in which a plurality of objects to be processed, such as semiconductor wafers w, can be simultaneously housed and subjected to a heating process such as an oxidation process, a diffusion process, and a depressurized CVD process. The heat-processing furnace 2 mainly includes: a processing vessel (also referred to as "reaction tube") 3 for housing wafers w in a tier-like manner and subjecting the wafers w to a predetermined heating process; a cylindrical heat insulating member 4 surrounding the processing vessel 3; and a helical heating resistor (also referred to as "heater line") 5 arranged along an inner circumferential surface of the heat insulating member 4. The heat insulating member 4 and the heating resistor 5 constitute a heater (heating apparatus) 6. In the below-described manufacturing method of the heat-processing furnace 2, a manufacturing method of the heater 6 is particularly explained.

The heat-processing apparatus 1 is provided with a base plate 7 on which the heater 6 is placed. An opening 8 is formed in the base plate 7 through which the processing vessel 3 is inserted upward from below. A not-shown heat insulating member is disposed on the opening 8 such that a gap between the base plate 7 and the processing vessel 3 is covered.

The processing vessel 3 is also referred to as "process tube". The processing vessel 3 is made of quartz, and is formed into an elongated cylindrical shape, with an upper end thereof being closed and a lower end thereof being opened. An outward flange is disposed on the opening end of the processing vessel 3. The flange is supported on the base plate 7 through a flange presser, not shown. The illustrated processing vessel 3 is provided, in a lower part thereof, with an inlet port 9 for introducing a process gas and an inert gas into the processing vessel 3, and a not-shown outlet port for discharging a gas in the processing vessel 2. A gas supply source is connected to the inlet port 9. Connected to the outlet port is an exhaust system having a vacuum pump capable of reducing a pressure to, e.g., about 10 Torr to $10^{-8}$ Torr.

A lid member 10 for closing the lower end opening (throat) of the processing vessel 3 is disposed below the processing vessel 3. The lid member 3 is capable of being vertically opened and closed and vertically moved by an elevating mechanism, not shown. Means for retaining heat of the throat, e.g., a heat retaining tube 11 is placed above the lid member 10. On an upper part of the heat retaining tube 11, there is placed a quartz boat 12 as a holder for holding a plurality of, e.g., about 100 to 150 wafers w each having a 300 mm diameter, at predetermined vertical intervals therebetween. The lid member 10 is equipped with a rotary mechanism 53 that rotates the boat 12 about an axis center thereof. By a downward movement of the lid member 10, the boat 12 is unloaded from the processing vessel 3 to a loading area below. After wafers w are transferred, the boat 12 is loaded into the processing vessel 3 by an upward movement of the lid member 10.

Figure 5:
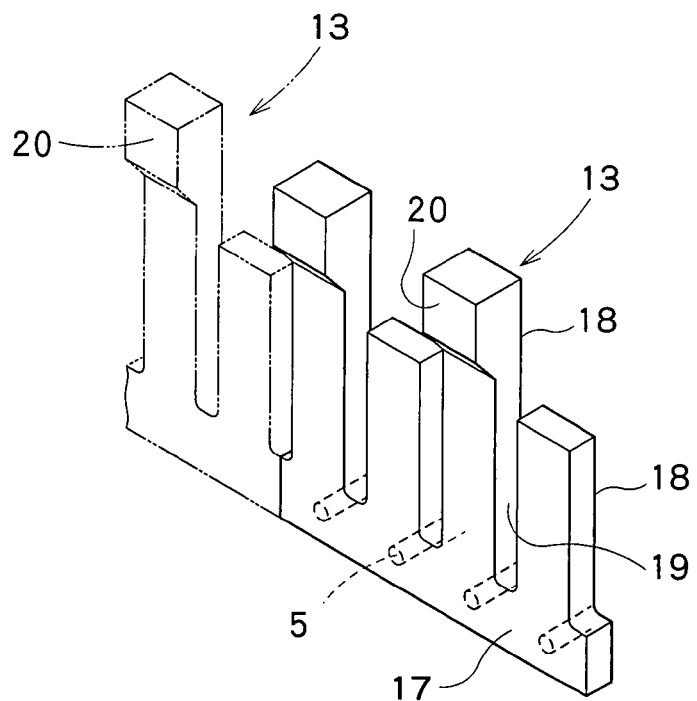
FIG. 5 is a perspective view of a support member.
Figure 6:
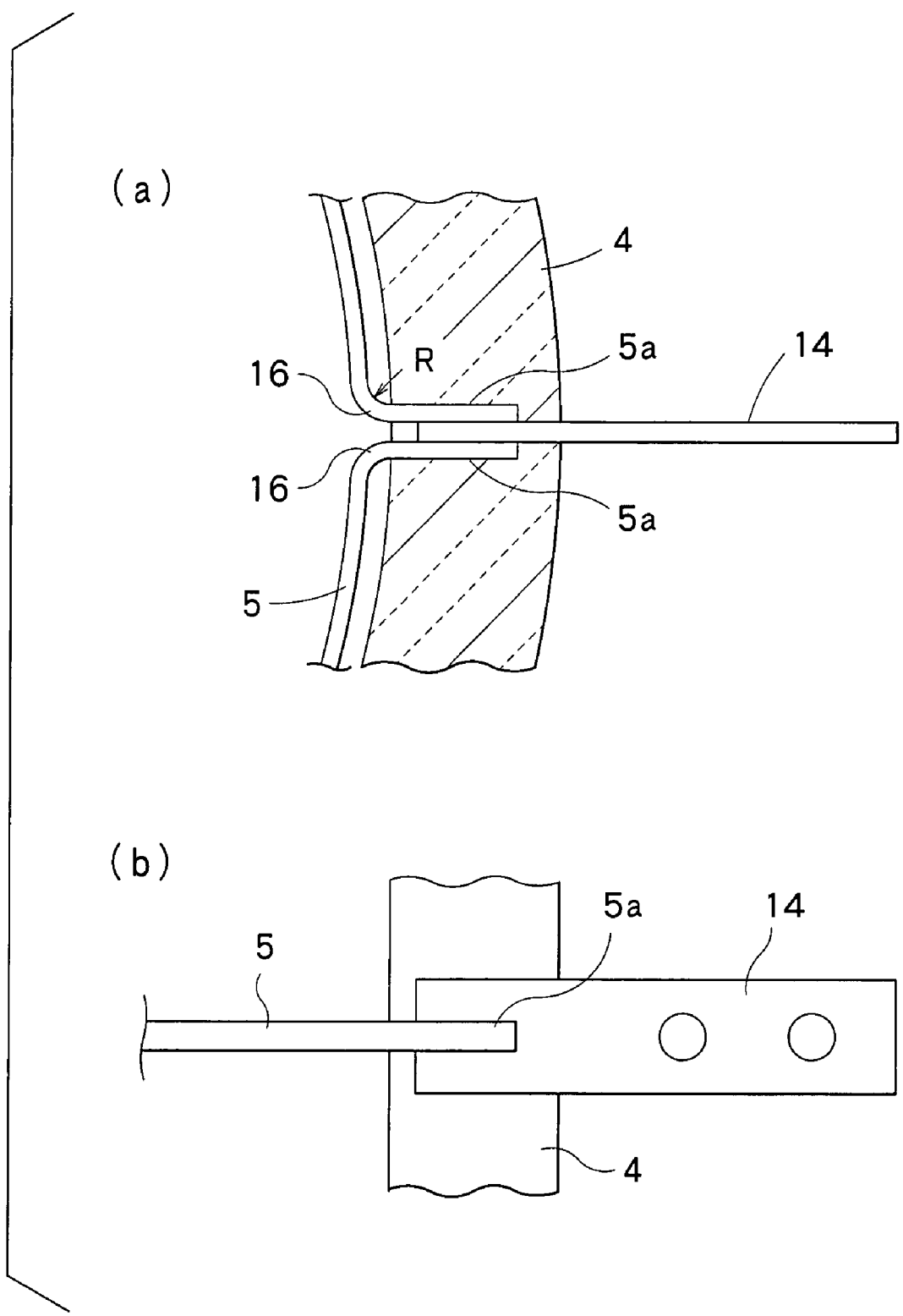
FIG. 6(a) is a plan view partially showing an attachment structure of a terminal plate to a heating resistor.
FIG. 6(b) is a side view partially showing an attachment structure of a terminal plate to the heating resistor.
Figure 7:
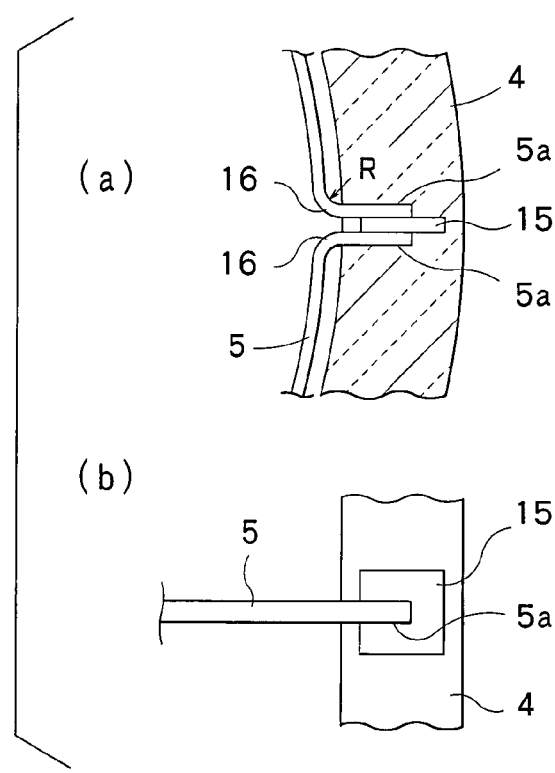
FIG. 7(a) is a plan view partially showing an attachment structure of a fixing plate to a heating resistor.
FIG. 7(b) is a side view partially showing an attachment structure of the fixing plate to a heating resistor.
Figure 8:
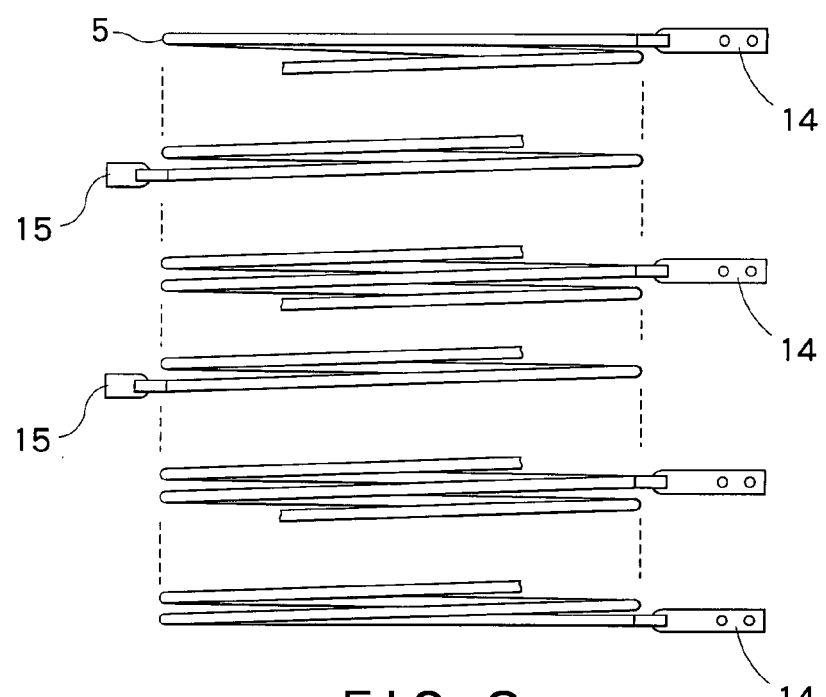
FIG. 8 is a side view schematically showing a heating resistor provided with the terminal plates and the fixing plates.

FIG. 5 is a perspective view of a support member. FIG. 6(a) is a plan view partially showing an attachment structure of a terminal plate to a heating resistor. FIG. 6(b) is a side view partially showing an attachment structure of a terminal plate to the heating resistor. FIG. 7(a) is a plan view partially showing an attachment structure of a fixing plate to a heating resistor. FIG. 7(b) is a side view partially showing an attachment structure of the fixing plate to a heating resistor. FIG. 8 is a side view schematically showing a heating resistor provided with the terminal plates and a fixing plates.

As shown in FIGS. 2 to 8, the heater 6 includes: the heat insulating member 4; the helical heating resistor 5 arranged along an inner circumference of the heat insulating member 4; support members 13 axially disposed on the inner circumferential surface of the heat insulating member 4, for supporting the heating resistor 5 at predetermined pitches; a plurality of terminal plates 14 axially arranged outside the heating resistor 5 at suitable intervals therebetween, the terminal plates 14 radially passing through the heat insulating member 4 to be extended outside; and a plurality of fixing plates 15 arranged outside the heating resistor 5 at suitable intervals therebetween and fixed inside the heat insulating member 4. The heating resistor 5 is a kanthal line which is an alloy line of, e.g., iron (Fe), chrome (Cr), and aluminum (Al). Although a thickness of the heating resistor 5 depends on a specification of the heat-processing furnace 2, the heating resistor 5 having a diameter of about 3.5 mm is used, for example.

The helical heating resistor 5 vertically arranged is fixed on the heat insulating member 4 through the terminal plates 14 for each zone, and is supported through the support members 13 such that the heating resistor 5 can thermally expand and thermally shrink. Under this state, when the heating resistor 5 is elongated by a creep or a thermal expansion and the like, the elongation tends to be accumulated on a lower side of each zone by gravitation. Thus, in order to prevent accumulation of the elongation of the heating resistor 5, which is caused by a creep or a thermal expansion and the liked, on the lower side of each zone, the fixing plates 15 are suitably attached to the heating resistor 5 at each turn or at dividing points for dividing a turn into a plurality of turns in each zone. The heating resistor 5 is fixed on the heat insulating member 4 by these fixing plates 15 and these terminal plates 14. As shown in FIG. 8, each fixing plate 15 is suitably attached to a turn between the adjacent terminal plates 14.

The heating resistor 5 is formed into a helical shape to have a predetermined winding diameter and predetermined pitches along the inner wall surface of the heat insulating member 4, such that the heating resistor 5 is not in contact with the heat insulating member 4. The terminal plates 14, which pass through the heat insulating member 4 to be extended outside so as to be connected to electrodes, are disposed at suitable intervals therebetween on the helical heating resistor 5 in the axial direction of the heat insulating member 4. Thus, an inside of the processing vessel 3, i.e., an inside of the heat-processing furnace 2 is vertically separated into a plurality of zones, and a temperature of each zone can be separately controlled. The terminal plates 14 are made of the same material as that of the heating resistor 5. In terms of prevention of fusion and inhibition of the amount of heat release, the terminal plate 14 is formed into a plate having a required cross sectional area.

In order to attach the terminal plate 14 to the heating resistor 5, the heating resistor 5 is severed at a part where the terminal plate 14 is to be attached, so as to form a pair of end parts 5a. Each end part 5a, which has been formed by severing the heating resistor 5, is bent radially outward the heat insulating member 4, so as to form a bent part 16. Opposite surfaces of the terminal plate 14 are fixed by welding between the pair of bent end parts 5a. In particular, the bent part 16 of the heating resistor 5 is of an R-bent shape in order to reduce concentration of stress applied to the welded joint.

The fixing plate 15 is made of the same material as that of the terminal plate 14, and has the same cross sectional shape as that of the terminal plate 14. However, the length of the fixing plate 15 is smaller than that of the terminal plate 14. The fixing plate 15 is embedded in the heat insulating member so as not to project outside. The fixing plate 15 is attached to the heating resistor 5 by the same attachment structure as that of the terminal plate 14 to the heating resistor 5. That is to say, as shown in FIGS. 6(a) and 6(b), in order to attach the terminal plate 15 to the heating resistor 5, the heating resistor 5 is severed at a part where the fixing plate 15 is to be attached, so as to form a pair of end parts 5a. Each end part 5a, which has been formed by severing the heating resistor 5, is bent radially outward the heat insulating member 4, so as to form a bent part 16. Opposite surfaces of the terminal plate 15 are fixed by welding between the pair of bent end parts 5a. The bent part 16 of the heating resistor 5 is of an R-bent shape.

As shown in FIG. 3, the heating resistor 5 is disposed inside the cylindrical heat insulating member 4, through the support members 13 made of a material having a heat resistance and a heat insulation property, such as ceramics, at arrangement pitches for securing a predetermined heat quantity, with a predetermined gap s between the heat resistor 5 and the inner wall surface of the heat insulating member 4 to allow a thermal expansion and a thermal shrinkage of the heat resistor 5. The support member 13 is divided into a plurality of parts in the axial direction of the heat insulating member 4. As shown in FIG. 5, each support member 13 has a proximal part 17 positioned inside the heating resistor 5, and a plurality of support pieces 18 each of which is radially extended outward from the proximal part 17 to pass through a space between the adjacent pitches of the heating resistor 5. The support pieces 18 are integrally formed with the proximal part 17, forming a shape resembling teeth of a comb. As shown in FIG. 4, with the heating resistor 5 being inserted in grooves 19 formed between the adjacent support pieces 18, the support member 13 loosely supports the heating resistor 5 at predetermined pitches, such that the heating resistor 5 can thermally expand and thermally shrink (move in radial and circumferential directions of the helical shape).

The support member 13 is attached inside the heat insulating member 4, with distal ends of the support pieces 18 being embedded in the heat insulating member 4. In this case, with a view to improving an attachment strength to prevent escape of the support member 13 from the heat insulating member 4, it is preferable that a distal end of each support piece 18 is suitably formed into an elongated shape, and that an enlarged portion or a projection 20 is formed on the distal end. The support members 13 are serially arranged along the axial direction of the heat insulating member 4, with the distal ends of the support pieces 18 being embedded in the heat insulating member 4 (see, FIG. 4), and are circumferentially arranged at predetermined intervals such as intervals of 30 degrees (see, FIG. 3).

In order to hold the shape of the heat insulating member 4 and reinforce the heat insulating member 4, as shown in FIG. 1, an outer circumference of the heat insulating member 4 is covered with an outer shell 21 made of metal such as stainless. In addition, in order to restrain a heat influence exerted on an outside of the heater, an outer circumference of the outer shell 21 is covered with a water cooling jacket 22. An upper heat insulating member 23 for covering the heat insulating member 4 is disposed on a top part of the heat insulating member 4. A stainless top plate 24 for covering a top part (upper end part) of the outer shell 21 is disposed on an upper part of the upper heat insulating member 23.

In order to precipitate a process or to improve a throughput by rapidly lowering temperatures of wafers after a heat process, the heater 6 is equipped with a heat exhaust system 26 that discharges an atmosphere in a space 25 between the heater 6 and the processing vessel 3 to outside, and a cooling unit 27 that forcibly cools the space 25 by introducing thereinto a cooling fluid (e.g., air). The heat exhaust system 26 is mainly composed of, for example, an outlet port 28 formed above the heater 6, and a not-shown heat exhaust pipe connecting the outlet port 28 and a not-shown factory exhaust system. An exhaust blower and a heat exchanger, not shown, are disposed in the heat exhaust pipe.

The cooling unit 27 includes a plurality of annular flow paths 29 formed between the heat insulating member 4 and the outer shell 21 in a height direction, and blowing holes 30 formed in the heat insulating member 4. A cooling fluid is blown out from the annular flow paths 29 through the blowing holes 30 in a central oblique direction of the heat insulating member 4 so that a spiral flow is generated in a circumferential direction of the space 25. The annular flow paths 29 are formed by adhering a strip-like or annular heat insulating members 31 to an outer circumference of the heat insulating member 4, or by annularly scraping the outer circumference of the heat insulating member 4.

Disposed in a height direction on an outer surface of the outer shell 21 is a common single supply duct, not shown, for dispensing and supplying a cooling fluid to the respective annular flow paths 29. Communication holes are formed in the outer shell 21 so that an inside of the supply duct and the respective annular flow paths 29 are communicated with each other. To the supply duct, there is connected, via an on/off valve, a not-shown cooling-fluid supply source (for example, a fan) that sucks air in a clean room as a cooling fluid and pressure-feeds the cooling fluid.

According to the heat-processing furnace 2 as structured above, the plurality of fixing plates 15 arranged at suitable intervals therebetween are disposed outside the heating resistor 5 and are fixed in the heat insulating member. Since the fixing plates 15 are attached to the heating resistor 5 by the same attachment structure as the attachment structure of the terminal plates 14 to the heating resistor 5, it is possible to restrain increase in temperature of the joints of the fixing plates 15 and concentration of stress applied thereto. In addition, an excellent sustainability can be provided in that the fixing plates 15 are rarely escaped from the heat insulating member 4, and thus durability of the heat-processing furnace 2 including the heating resistor 5 can be enhanced. Since the heating resistor 5 is suitably fixed on the heat insulating member 4 by the fixing plates 15 at each turn, in addition to the support members 13 and the terminal plates 14, it is possible to prevent that elongation of the heating resistor 5, which is caused by a creep or a thermal expansion and the like, is accumulated at one end side. Therefore, since there is no possibility that a winding diameter at one end side of the heating resistor 5 is increased so that the heating resistor 5 comes into contact with the inner circumferential surface of the heat insulating member 4, deformation such as buckling and breakage of the heating resistor 5 can be prevented, which results in improvement in durability of the heating resistor 5.

In the attachment structure of the fixing plate 15, similar to the attachment structure of the terminal plate 14, the heating resistor 5 is severed at a part where the fixing plate 15 is to be attached, so as to form a pair of end parts 5a. Each end part 5a is bent radially outward the heat insulating member 4, so as to form a bent part 16 which is of an R-bent shape. The opposite surfaces of the terminal plate 15 are fixed by welding between the pair of bent end parts 5a. Further, the fixing plate 15 is made of the same material as that of the terminal plate 14, and has the same cross sectional shape as that of the terminal plate 14. The fixing plate 15 is embedded in the heat insulating member 4 so as not to project outside. Actual performance of the terminal plate 14 and its attachment structure has been proved. Namely, no crack or overheat occur during use. An excellent sustainability in the heat insulating member 4 can be provided, whereby it is unlikely that the terminal plate 14 is escaped from the heat insulating member 4. By applying the attachment structure of the terminal plate 14 to the fixing plate 15, the same effects can be produced.

That is to say, since the fixing plates 15 are held in the heat insulating member 4 which is radially remote outward from the position of the heating resistor 5, the joints between the fixing plates 15 and the heating resistor 5 are rarely overheated due to the heat liberation effect. Namely, temperatures of the joints can be maintained low, whereby durability of the joints and thus the heating resistor 5 can be improved. Since the bent part 16 which is bent in the radial direction of the heating resistor 5 is of an R-bent shape, concentration of stress applied to the joints, which is caused by a thermal shrinkage of the heating resistor 5, can be absorbed and alleviated. Therefore, generation of cracks or breaking can be restrained, so that durability can be improved. Moreover, since the fixing plate 15 has the same cross section as that of the terminal plate 14, the fixing plate 15 can have an excellent sustainability in the heat insulating member 4, and is rarely escaped therefrom. Therefore, a fixing performance of the heating resistor 5 can be maintained for a long period of time, to thereby improve durability (extension in life duration) of the heating resistor 5 and thus the heat-processing furnace 2.

Next, modifications of the fixing plate 15 are described with reference to FIGS. 11(a) to 11(f).

Figure 11:
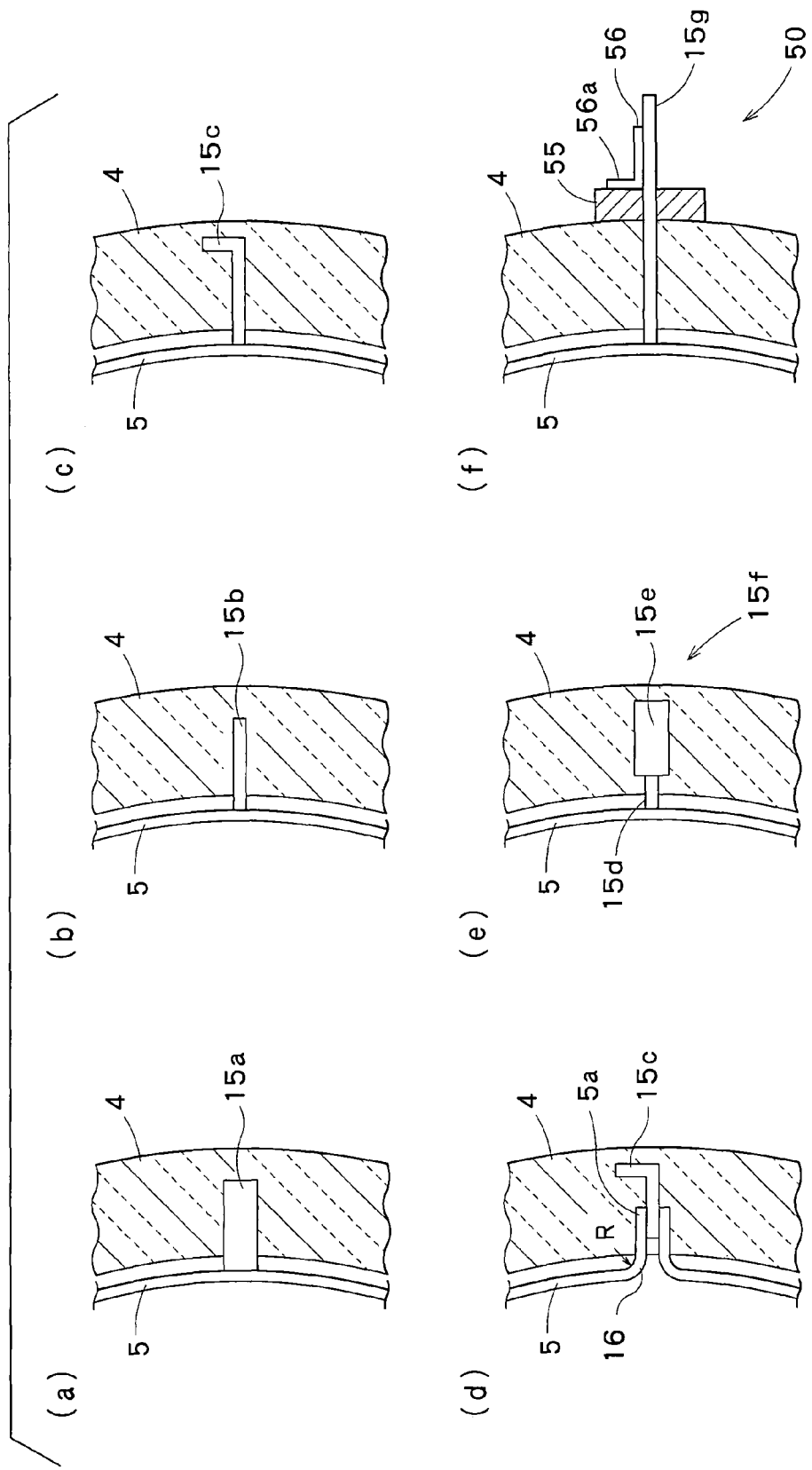
FIGS. 11(a) to 11(f) are plan views showing modifications of the fixing plate attached to the heating resistor.

In the above embodiment, the fixing plate 15 is sandwiched between the pair of end parts 5a of the heating resistor 5. However, not limited thereto, as shown in FIGS. 11(a) and 11(b), fixing plates 15a and 15b may be directly fixed on a side surface (not the end 5a) of the heating resistor 5 with the use of welding means. In this case, the fixing plates 15a and 15b may have an elongated angular shape as shown in FIG. 11(a), or a square bar shape or a round bar shape as shown in FIG. 11(b).

As shown in FIGS. 11(c) and 11(d), a distal end of a fixing plate 15c may be bent in the heat insulating member 4. By bending the distal end of the fixing plate 15c, the fixing plate 15c can be more securely fixed in the heat insulating member 4, so that the heating resistor 5 can be more securely fixed to the heat insulating member 4.

In this case, as shown in FIG. 11(c), the fixing plate 15c may be directly fixed on the side surface of the heating resistor 5 with the use of welding means. Alternatively, as shown in FIG. 11(d), the fixing plate 15c may be sandwiched between the pair of end parts 5a of the heating resistor 5. The shape of the fixing plate 15c is not particularly limited, and the fixing plate 15c may have, for example, an elongated angular shape, a square bar shape, or a round bar shape. In addition, a bent direction of the distal end of the fixing plate 15c is not particularly limited, and the distal end may be bent in all directions.

As shown in FIG. 11(e), a fixing plate 15f may have a smaller diameter part (thinner part) 15d and a larger diameter part (thicker part) 15e disposed on a distal end of the smaller diameter part 15d. By disposing the larger diameter part 15e on the distal end of the smaller diameter part 15d, the fixing plate 15f can be more securely fixed in the heat insulating member 4, so that the heating resistor 5 can be more securely fixed to the heat insulating member 4.

In this case, as shown in FIG. 11(e), the fixing plate 15f may be directly fixed on the side surface of the heating resistor 5 with the use of welding means. Not limited thereto, the fixing plate 15f may be sandwiched between the pair of end parts of the heating resistor 5 (not shown). FIG. 11(e) illustrates the smaller diameter part 15d as the thinner part and the larger diameter part 15e as the thicker part, each having a round bar shape of a circular cross section. However, not limited thereto, each of the thinner part and the thicker part may have an elongated angular shape or a square bar shape.

Alternatively, the thicker part may be formed separately from the smaller diameter part (thinner part) 15d. Namely, the thicker part may be an article (e.g., a nut) fitted on the distal end of the smaller diameter part (thinner part) 15d. In this case, the cross section of the smaller diameter part (thinner part) 15d may be circular, while the cross section of the thicker part is not circular but may be hexagonal, for example.

Alternatively, as shown in FIG. 11(f), a fixing plate 15g may radially pass through the heat insulating member 4 to be extended outside, and may be fixed on an outer surface of the heat insulating member 4 by fixing means 50. In this case, as shown in FIG. 11(f), the fixing means 50 is formed of a fixing member 55 fixed on the outer surface of the heat insulating member 4, and an L-shaped bracket 56 disposed on an outer surface of the fixing member 55 to support the fixing plate 15g on the fixing member 55.

Since the fixing plate 15g radially passes through the heat insulating member 4 to be extended outside, and the extended part is fixed on the outer surface of the heat insulating member 4, the fixing plate 15g can be more securely fixed to the heat insulating member 4, so that the heating resistor 5 can be more securely fixed to the heat insulating member 4.

In this case, as shown in FIG. 11(f), the heating plate 15g may be directly fixed on the side surface of the heating resistor 5 with the use of welding means. Not limited thereto, the fixing plate 15g may be sandwiched between the pair of end parts of the heating resistor 5 (not shown). The shape of the fixing plate 15g is not particularly limited, and the fixing plate 15g may have, for example, an elongated angular shape, a square bar shape, or a round bar shape. A direction of a leg portion 56a of the L-shaped bracket 56 is not particularly limited, and the leg portion 56a may be oriented in all the directions.

Figure 9:
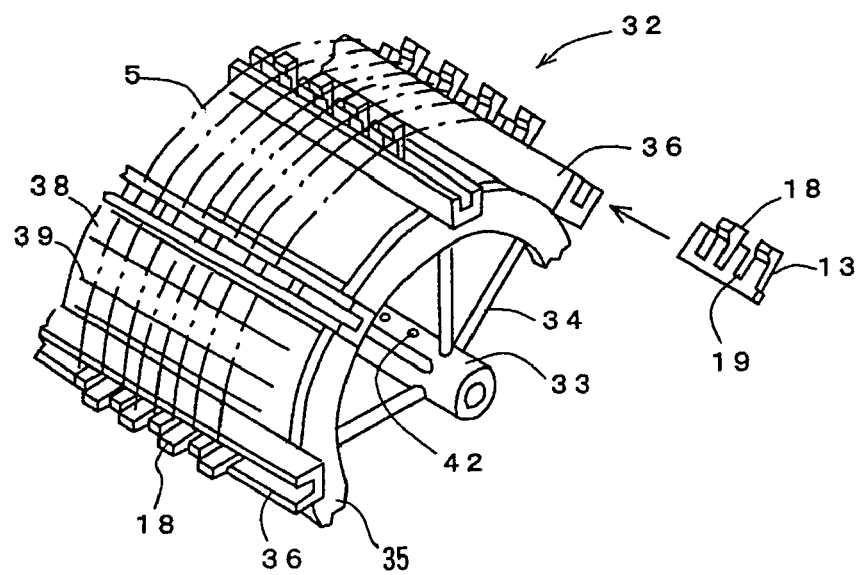
FIG. 9 is a perspective view explaining a structure of a jig used in a manufacturing method of a heat-processing furnace to which the present invention is applied.
Figure 10:
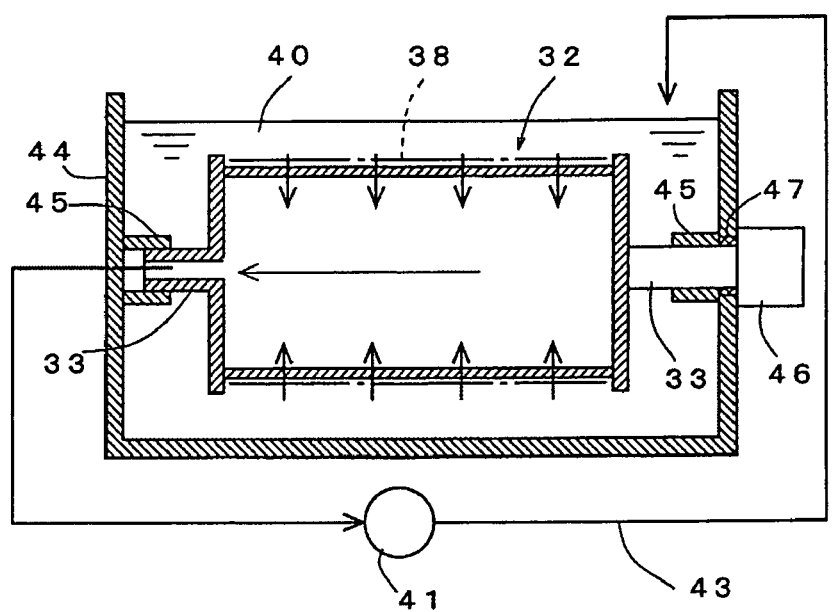
FIG. 10 is a schematic view explaining a step of depositing a heat insulating member on a filter member in a manufacturing method of a heat-processing furnace according to the present invention.

Next, an example of a manufacturing method of the heat-processing furnace 2, to be specific, the heater 6 is described with reference to FIGS. 9 and 10. FIG. 9 is a perspective view explaining a structure of a jig used in a manufacturing method of a heat-processing furnace to which the present invention is applied. FIG. 10 is a schematic view explaining a step of depositing a heat insulating member on a filter member in a manufacturing method of a heat-processing furnace according to the present invention.

At first, there are prepared the heating resistor 5 which has been previously helically formed and provided with the terminal plates 14 and the fixing plates 15, the support members 13 for supporting the heating resistor 5, and a drum-like jig 32 for supporting the support members 13. The jig 32 is formed into a drum-like shape, and includes: a hollow support shaft 33; annular substrates 35 axially arranged at suitable intervals therebetween on the support shaft 33 through radial spokes 34; and guide members 36 bridging the substrates 35 by using grooves radially formed in the substrates 35 relative to an axial direction, the guide members 36 being circumferentially arranged at equal intervals therebetween. Each of the guide members 36 is of substantially a U-shaped cross section and is opened outward relative to outer circumferences of the substrates 35. The support members 13 are serially disposed in the guide members 36 of the jig 32. A plurality of suction holes 42 are formed in a periphery of the support shaft 33. While the jig 32 as structured above is being rotated, the heating resistor 5 is helically wound around the jig 32 by passing the helical heating resistor 5 from one end of the jig 32 through each groove 19 between the support pieces 18 of the respective support members 13.

Then, a meshed filter member 38 is arranged outside the heating resistor 5 on the jig 32, with avoiding the terminal plates 14, the fixing plates 15 and the support pieces 18 of the respective support members 13. Thereafter, a plurality of bar members 39 of a smaller diameter are circumferentially arranged at suitable intervals therebetween on the filter member 38 in the axial direction of the heating resistor 5. The filter member 38 is preferably an aluminum fine mesh member. As the bar member 39, a stainless steel round bar having a diameter of, e.g., about 1 mm to 2 mm is preferable. The filter member 38 of a predetermined thickness is disposed over all the outer circumference of the heating resistor 5, with avoiding the support pieces 18, the terminal plates 14, and the fixing plate 15, such that the filter member 38 can be axially drawn out. The bar members 39 are disposed on the filter member 38 and are fixed thereto by means of a thread or a rubber ring.

As shown in FIG. 10, the jig 32 is immersed into a suspension 40 containing inorganic fibers as a heat insulating material. By sucking the heat insulating material from an inside of the jig 32, the heat insulating material is deposited on the filter member 38. In this case, by rotating the jig 32, the suspension 40 of the heat insulating material can be stirred, and the heat insulating material can be deposited on the filter member 38 with a uniform thickness. As the suspension 40, there is used a slurry suspension made of: inorganic fibers containing, e.g., silica, alumina, or aluminum silicate; water; and a binder.

By means of a suction pump 41 connected to the hollow support shaft 33 of the jig 32, an inside of the heating resistor 5 is depressurized through the suction holes 42 in the support shaft 33. Then, the suspension 40 is pulled toward a surface of the filter member 38, so that a fibrous component, which is the heat insulating material incapable of transmitting the filter member 38, is laid on the filter member 38. The water and the fibrous component having transmitted the filter member 38 are collected through a discharge pipe 43 of the suction pump 41. The collected water and fibrous component may be circulated again through a suspension tank 44.

In this case, by rotating the jig 32 through the support shaft 33, the suspension 40 in the suspension tank 44 can be stirred, and the heat insulating material can be deposited on the filter member 38 with a uniform thickness. The jig 32 may be rotated by driving a motor 46 connected to one of the support shaft 33 fitted in a bearing 45. At this time, an air-tight sealing member 47 is preferably disposed between the suspension tank 44 and the support shaft 33, for example, so as to prevent leakage of liquid from the suspension tank 44. In this step, the heat insulating member 4 having a desired layer thickness is formed, and the distal ends of the support pieces 18 of the respective support members 13, the terminal plates 14, and the fixing plates 15 are embedded in the heat insulating member 4.

Subsequently, the jig 32 is drawn up from the suspension 40, and the heat insulating material deposited on the filter member 38 is naturally or forcibly dried, so that the cylindrical heat insulating member 4 can be obtained. After dried, the bar members 39 are axially drawn out from a space between the heat insulating member 4 and the filter member 38, and then the filter member 38 is drawn out from a space between the heat insulating member 4 and the heating resistor 5. Since each bar member 39 is of a smaller diameter and an area thereof contacting the heat insulating member 4 is small, it is easy to draw out the bar members 39. By drawing out the bar members 39, there is formed a slight gap between the heat insulating member 4 and the filter member 38, it is relatively easy to draw out the filter member 38. By drawing out the filter member 38, the gap s (corresponding to the thicknesses of the filter member 38 and the bar member 39) is formed between the heat insulating member 4 and the heating resistor 5. Due to the gap s, the heating resistor 5 is allowed to move in a radially outward direction by a thermal expansion thereof.

By drawing out the jig 32 supporting the support member 13 from in the axial direction of the heat insulating member 4, the jig 32 is removed from the support members 13. Following thereto, by processing a surface of the heat insulating member 4, there is obtained the heat-processing furnace 2, i.e., the heater 6 in which the heating resistor 5 is disposed on the inner wall surface of the cylindrical heat insulating member 4 through the support members 13.

According to the manufacturing method of the heat-processing furnace 2 including the above steps, it is possible to restrain increase in temperature of the joints of the fixing plates 15 and concentration of stress applied thereto. At the same time, an excellent sustainability can be provided in that the fixing plates 15 are rarely escaped from the heat insulating member 4, whereby the highly durable heat-processing furnace including the heating resistor can be obtained. Further, the heating resistor 5 is formed into a helical shape beforehand. By using the support members 13 each having the proximal part 17 positioned inside the heating resistor 5 and the plurality of support pieces 18 each of which is radially extended outward from the proximal part 17, and the jig 32 for positioning the support members 13 at predetermined circumferential positions and axially aligning the support members 13, the heating resistor 5 is mounted on the jig 32 while it is being rotated through the support members 13. Thus, an operation for helically winding the heating resistor 5 can be omitted. Furthermore, owing to the plurality of support pieces 18 of the respective support members 13, arrangement pitches of the heating resistor 5 can be automatically set. Thus, an operation for the arrangement can be omitted, as well as precision of the arrangement pitches can be enhanced.

In the present invention, in the step of forming the heat insulating member 4 outside the heating resistor 5, the heat insulating material can be deposited outside the heating resistor 5 through the filter member 38 by the mere sucking action from the inside of the heating resistor 5 immersed in the suspension 40, so that the heat insulating member 4 can be formed outside the heating resistor 5. Namely, there is no need for assembling a mold and releasing the mold. Further, since the heat insulating member 4 does not require a baking process, but requires only a drying process, the heat insulating member 4 can be formed for a shorter period of time. Furthermore, when the filter member 38 interposed between the heating resistor 5 and the heat insulating member 4 is drawn out after the molding step, the filter member 38 can be easily drawn out from the heat insulating member 4. This is because, by drawing the bar members 39 interposed between the filter member 38 and the heat insulating member 4, there is formed a gap between the filter member 38 and the heat insulating member 4. In addition, since plate surfaces of the terminal plates 14 are positioned in the axial direction of the heat insulating member 4, the filter member 38 is not rarely caught by the terminal plates 14. Therefore, in a manufacturing process of the heat-processing furnace 3, workability can be improved, while a manufacturing period can be reduced. In addition, precision of the arrangement pitches of the heating resistor 5 can be improved.

The present invention is not limited to the above embodiment, and various design changes are possible within the scope of the present invention. For example, the processing vessel may be a processing vessel to which a cylindrical manifold equipped with an inlet tube part and an exhaust tube part, the manifold being made of a heat resistive metal, such as stainless steel. Alternatively, the processing vessel may be a processing vessel of a dual tube structure.

The invention claimed is:

1. A heat-processing furnace comprising:
a processing vessel for housing an object to be processed to thermally heat the object to be processed;
a cylindrical heat insulating member surrounding the processing vessel;
a helical heating resistor disposed along an inner circumferential surface of the heat insulating member;
support members axially disposed on the inner circumferential surface of the heat insulating member, for supporting the heating resistor at predetermined pitches;
a plurality of terminal plates disposed radially outside the heating resistor at suitable intervals therebetween and attached to the heating resistor, the terminal plates radially passing through the heat insulating member to outside the heat insulating member; and
a plurality of fixing plates disposed radially outside the heating resistor at suitable intervals therebetween and attached to the heating resistor, the fixing plates being fixed in the heat insulating member;
wherein the fixing plates are attached to the heating resistor by the same attachment structure as the attachment structure of the terminal plates to the heating resistor,
wherein the heating resistor includes pairs of end parts formed by severing a part of the heating resistor where the fixing plates and the terminal plates are attached, and by bending each end part to have an R-shape and to extend radially outwardly from the heat insulating member, and
wherein opposite surfaces of each fixing plate and each terminal plate are sandwiched between opposing, severed bent parts of the heating resistor, and are fixed on such parts by welding.

2. The heat-processing furnace according to claim 1, wherein
the fixing plate is made of the same material as that of the terminal plate, and has the same cross sectional shape as that of the terminal plate, the fixing plate being embedded in the heat insulating member so as not to project outside.

3. The heat-processing furnace according to claim 1, wherein
the heating resistor is supported by the supporting members with a predetermined gap between the heating resistor and the inner circumferential surface of the heat insulating member, in such a manner that the heating resistor can thermally expand and thermally shrink.

4. The heat-processing furnace according to claim 1, wherein
each support member includes a proximal part positioned inside the heating resistor, and a plurality of support pieces radially extended outward from the proximal part, and
each support piece is provided, at a radially outward distal end thereof, with an enlarged portion or a projection.

5. The heat-processing furnace according to claim 1, wherein
each fixing plate is directly fixed on a side surface of the heating resistor, and
each fixing plate is embedded in the heat insulating member.

6. The heat-processing furnace according to claim 1, wherein
each fixing plate is embedded in the heat insulating member, and
a distal end of each fixing plate is bent in the heat insulating member.

7. The heat-processing furnace according to claim 1, wherein
each fixing plate has a thinner part and a thicker part disposed on a distal end of the thinner part.

8. A method of manufacturing a heat-processing furnace including a processing vessel for housing an object to be processed to thermally heat the object to be processed; a cylindrical heat insulating member surrounding the processing vessel; a helical heating resistor disposed along an inner circumferential surface of the heat insulating member; support members axially disposed on the inner circumferential surface of the heat insulating member, for supporting the heating resistor at predetermined pitches;
the method comprising the steps of:
preparing a helical heating resistor to which a plurality of terminal plates and a plurality of fixing plates are fixed by the same attachment structure, support members each having a proximal part positioned inside the heating resistor and a plurality of support pieces radially extending outward from the proximal part, and a jig for positioning the support members at predetermined circumferential positions and axially aligning the support members, mounting the heating resistor on the jig by using the supporting members, while rotating the jig;
arranging a filter member on an outer circumference of the heating resistor, with avoiding the terminal plates, the fixing plates, and the supporting pieces of the respective support members, and arranging a plurality of bar members of a small diameter at suitable intervals therebetween on the filter member;
immersing the heating resistor in a suspension containing inorganic fibers as a heat insulating material, and thereafter depositing the heat insulating material on the filter member by suction from inside of the heating resistor;
drying the heat insulating material deposited on the filter member to form a heat insulating member;
after the drying step, drawing out the bar members from a space between the heat insulating member and the filter member;
drawing out the filter member from a space between the heat insulating member and the heating resistor; and
removing the jig from the supporting members,
wherein the step of preparing a helical heating resistor to which a plurality of terminal plates and a plurality of fixing plates are fixed by the same attachment structure comprises the step of:
severing the heating resistor where each fixing plate and each terminal plate is to be attached, so as to form a pair of severed end parts;
bending each severed end part to form a R-bent shape such that the severed end parts form a pair of opposing end parts that extend radially outwardly from the heat insulating member; and
sandwiching opposite surfaces of each fixing plate and each terminal plate between a pair of opposing end parts of the heating resistor, and fixing each plate between the opposing end parts by welding.

* * * * *